(12) United States Patent
Mandel et al.

(10) Patent No.: US 7,230,829 B2
(45) Date of Patent: Jun. 12, 2007

(54) OVERMOLDED ELECTRONIC ASSEMBLY WITH INSERT MOLDED HEAT SINKS

(75) Inventors: Larry M Mandel, Noblesville, IN (US); David A. Laudick, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 337 days.

(21) Appl. No.: 11/045,211

(22) Filed: Jan. 28, 2005

(65) Prior Publication Data

US 2006/0171120 A1    Aug. 3, 2006

(51) Int. Cl.
*H05K 7/20* (2006.01)
*A05K 3/30* (2006.01)

(52) U.S. Cl. .......................... 361/704; 29/841; 29/827; 29/832; 257/788; 257/796; 361/707; 361/708

(58) Field of Classification Search ...................... None
See application file for complete search history.

(56) References Cited

U.S. PATENT DOCUMENTS

| | | | |
|---|---|---|---|
| 4,926,241 A * | 5/1990 | Carey | 257/698 |
| 5,311,060 A * | 5/1994 | Rostoker et al. | 257/796 |
| 6,180,045 B1 | 1/2001 | Brandenburg et al. | |
| 6,285,551 B1 | 9/2001 | Brandenburg et al. | |
| 6,307,749 B1 | 10/2001 | Daanen et al. | |
| 6,693,239 B2 | 2/2004 | Myers et al. | |
| 6,779,260 B1 * | 8/2004 | Brandenburg et al. | 29/841 |
| 7,132,746 B2 * | 11/2006 | Brandenburg et al. | 257/713 |
| 2005/0081377 A1 * | 4/2005 | Brandenburg et al. | 29/855 |

* cited by examiner

*Primary Examiner*—Gregb Thompsopn
(74) *Attorney, Agent, or Firm*—Jimmy L. Funke

(57) ABSTRACT

An overmolded electronic assembly includes a substrate, a plurality of surface mount technology (SMT) integrated circuit (IC) chips, a plurality of heat sinks, a backplate and an overmold material. The substrate includes a plurality of conductive traces formed on a first surface of the substrate. The IC chips each include an active front side and a backside and the IC chips are electrically coupled to one or more of the traces. The heat sinks are each in thermal contact with the backside of a different one of the IC chips and are independent of each other. The backplate is attached to a second surface of the substrate, which is opposite the first surface of the substrate. The overmold material covers the first surface of the substrate and maintains the heat sinks in thermal contact with an associated one of the IC chips.

19 Claims, 2 Drawing Sheets

OVERMOLDED ELECTRONIC ASSEMBLY WITH INSERT MOLDED HEAT SINKS

TECHNICAL FIELD

The present invention is generally directed to an overmolded electronic assembly and, more specifically, to an overmolded electronic assembly with insert molded heat sinks.

BACKGROUND OF THE INVENTION

Traditionally, overmolded electronic assemblies have utilized heat sink plates, having multiple integrated heat sink pedestals, as a primary thermal path for removing heat from flip-chip components mounted to a substrate of the electronic assembly. Usually, the heat sink plate has been made of a die cast aluminum and a thermal interface material has been placed between a flip-chip and its associated heat sink pedestal. Irrespective of whether an electronic assembly has been of a single plate or dual plate design, the heat sinks pedestals have been integrated into the plate. Unfortunately, utilizing a single plate with multiple integrated heat sink pedestals has required precise positioning and height tolerances for the pedestals. Typically, these precise height tolerances have required machining the pedestals formed on the single plate, usually as a secondary process. If the pedestals are not machined, the interface gap between the pedestal face and an associated flip-chip may be greater than desired, which, in turn, leads to poor heat transfer between the flip-chip and the pedestal.

During the overmolding process for an electronic assembly, it is common to use a Bellville-type washer to prevent plate bending, substrate cracking and damage to flip-chips and/or solder joints, due to relatively high mold clamp pressures. Even if the plate is machined, the Bellville-type washer is typically required, due to the tolerance stack-up between flip-chip-to-flip-chip and/or plate-to-plate and/or flip-chip-to-plate. During the overmold process, it is frequently difficult to adequately support the substrate to prevent damage to the substrate, due to the fill and pack pressures that typically exist in the overmold process. The lack of sufficient substrate support, due to the various electronic components, is known to lead to substrate warpage and/or cracking.

During the overmold process, when the overmold material is injected into the mold, pressures are typically unequal causing the substrate to flex. When the overmold material cures, the substrate may be set in a warped state, which can cause undesirable stresses on solder joints, connector pins, board traces, etc., which may cause the overmolded electronic assembly to experience a premature failure in the field. Further, in such electronic assemblies, the secondary heat path for removing heat from the flip-chip is not as good as it could be, as the heat flows from the substrate through the overmold material and then to ambient air.

What is needed is an overmolded electronic assembly that is economical to produce, less prone to tolerance stack-up and that provides better substrate support during the overmold process.

SUMMARY OF THE INVENTION

The present invention is generally directed to an overmolded electronic assembly that includes a substrate, a plurality of surface mount technology (SMT) integrated circuit (IC) chips, a plurality of heat sinks, a backplate and an overmold material. The substrate includes a plurality of conductive traces formed on a first surface of the substrate. The IC chips each include an active front side and a backside and the IC chips are electrically coupled to one or more of the traces. The heat sinks are each in thermal contact with the backside of a different one of the IC chips and are independent of each other. The backplate is attached to a second surface of the substrate, which is opposite the first surface of the substrate. The overmold material covers the first surface of the substrate and maintains the heat sinks in contact with an associated one of the IC chips.

According to another aspect of the present invention, the heat sinks are made of a metal. According to this aspect, the metal is one of an aluminum and a copper. According to another embodiment of the present invention, the second surface of the substrate is attached to the backplate with an adhesive. According to this aspect, the adhesive may be a pressure sensitive adhesive (PSA). According to a different aspect, the IC chips are flip-chips and the heat sinks are molded. According to yet a different embodiment of the present invention, the backplate is made of aluminum.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
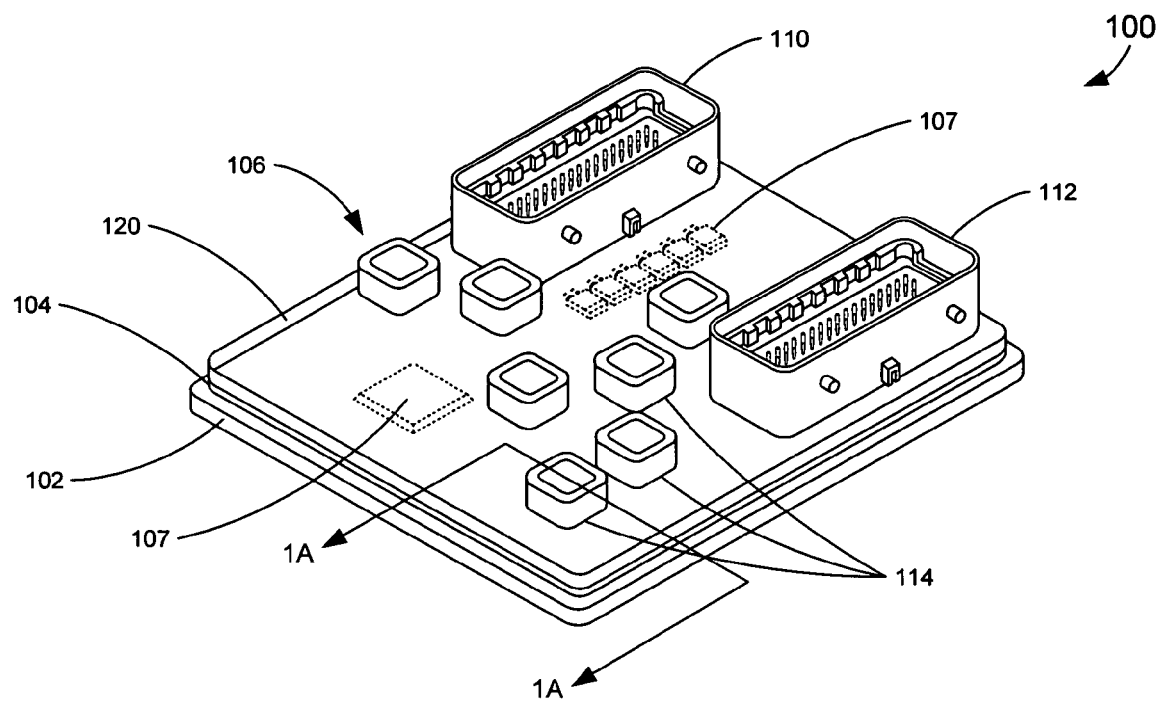
FIG. 1 is a perspective view of an exemplary overmolded electronic assembly, constructed according to one embodiment of the present invention.

According to one embodiment of the present invention, an overmolded electronic assembly is described herein that includes heat sinks that are insert molded in place independent of each other. The heat sinks may be fabricated using standard stamping techniques and do not require machining. According to the present invention, a mold is utilized that ensures that each heat sink maintains contact with its associated IC chip. It should be appreciated that the heat sinks may be made of a variety of materials, such as aluminum or copper, which has a thermal conductivity four times higher than die cast aluminum. The mold uses a common technique, such as an adjustable shoulder bolt and spring, at each IC chip location, to maintain each individual heat sink in thermal contact with its associated chip. This, in turn, isolates the chips from high-mold clamp forces, while maintaining appropriate forces between the heat sinks and the chips that overcome the mold fill pressure, and, thus, maintain thermal contact between each of the chips and their associated heat sink.

According to one embodiment of the present invention, electronic components are placed on one side of a substrate, e.g., a printed circuit board (PCB). According to this embodiment, the opposite side of the substrate is adhered to a backplate using adhesive tape, such as a pressure sensitive adhesive (PSA). Suitable PSAs are manufactured by Bergquist, Chomerics and Polymer Science. In general, lamination of the substrate to the backplate is superior, as the mold shutoff can be in one plane and the draft can be in one direction. Further, flash is minimal as the parting line resides at the plate, where shut-off is normally easiest to achieve. In general, the PSA serves three purposes. First, the PSA keeps the substrate flat against the plate, preventing warpage and residual stresses. Second, the PSA prevents mold material from flowing between the board and the plate and, thus, the strength of the plate is utilized to oppose the molding pressures (and not the substrate). Finally, the PSA permits an excellent secondary path for heat transfer, i.e., heat flowing from the substrate through the PSA and from the plate to ambient air.

As stated above, an overmolded electronic assembly, constructed according to the present invention, does not suffer from tolerance accumulation as it reduces the number of contact mating surfaces. Further, an overmolded electronic assembly, constructed according to the present invention, has fewer stresses being induced into the substrate of the electronic assembly, as it better accommodates the required clamp, fill and pack pressures in the mold tool. An overmolded electronic assembly, constructed according to the present invention, also allows for the practical use of a preferred heat sink material, such as stamped copper, simplifies mold shut-off for less mold flash, significantly improves the secondary heat transfer path and ensures thermal contact of each IC chip to its associated heat sink.

With reference to FIG. 1, an overmolded electronic assembly 100, configured according to one embodiment of the present invention, is depicted. The assembly 100 includes a substrate 104, e.g., a printed circuit board (PCB), that is attached to a backplate 102, with, for example, a pressure sensitive adhesive (PSA) 111. The substrate 104 includes a plurality of conductive traces formed on a first surface of the substrate 104. A plurality of surface mount technology (SMT) integrated circuit (IC) chips 106, e.g., flip-chips each including an active front side and a backside, are electrically coupled to one or more of the traces formed on the substrate 104. A backside of the chips 106 is in thermal contact with an associated heat sink 114. The heat sink 114 may, for example, be made of a metal, such as aluminum or copper, and may be molded (aluminum) or stamped (copper). A number of other electronic components 107 may also be coupled to one or more of the plurality of conductive traces formed on the substrate 104. As is shown in FIG. 1, connectors 110 and 112 are electrically coupled to the traces of the substrate 104 to provide electrical contact to one or more external devices.

Figure 1A:
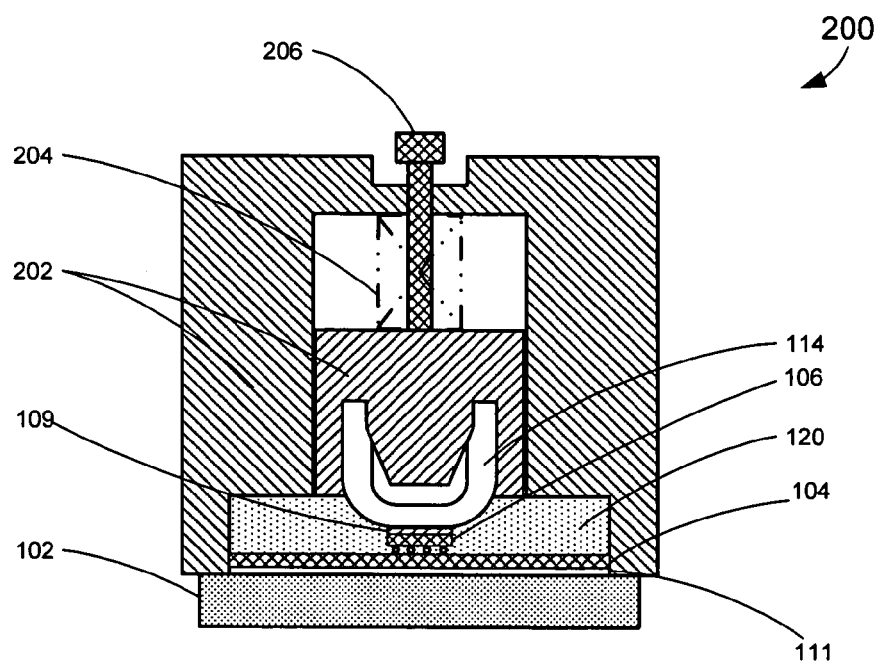
FIG. 1A is a cross-sectional view of a relevant portion of the overmolded electronic assembly of FIG. 1 in a mold.

With reference to FIG. 1A, a relevant portion of a mold 200 is depicted that is utilized to place each of the heat sinks 114 in thermal contact with one of the flip-chips 106 during overmolding. As is shown in FIG. 1A, a thermal interface material 109 thermally interfaces the heat sink 114 to the flip-chip 106. The mold 200 includes a mold set 202 that has a stationary portion and a moving portion. The moving portion of the mold set 202 is adjusted by a screw 206 that is biased by a spring 204. During the overmold process, an overmold material 120 is injected into the mold. The overmold material 120 encompasses a portion of the heat sink 114 and, when cured, retains the heat sink 114 in thermal contact with the flip-chip 106.

Figure 2:
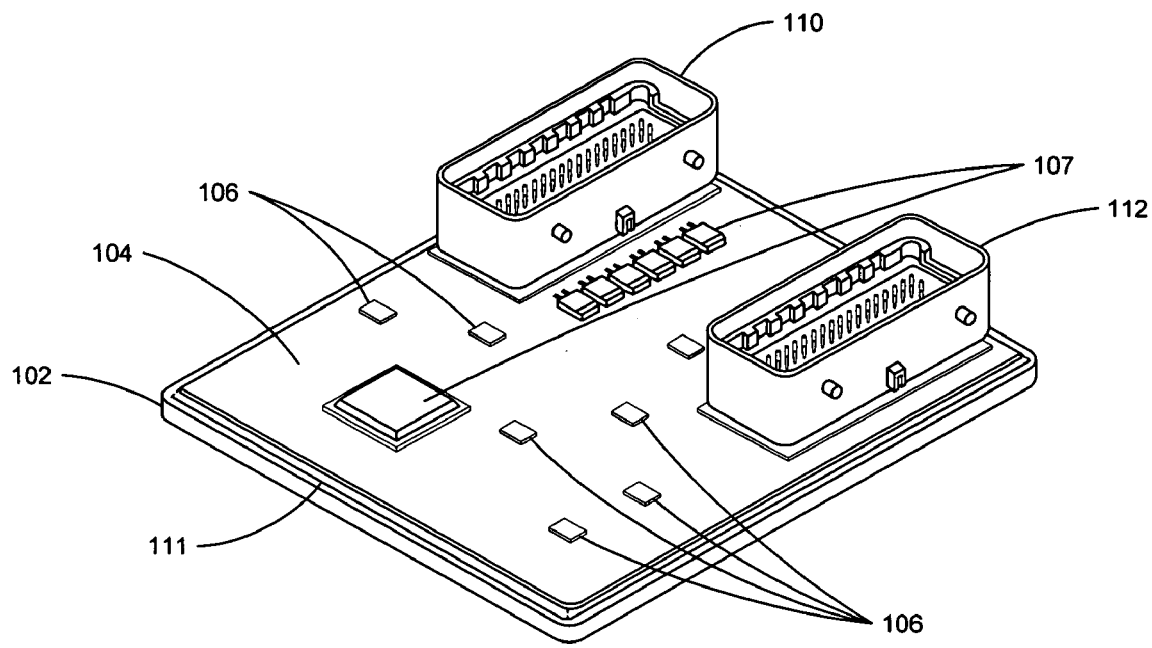
FIGS. 2–3 depict the overmolded electronic assembly of FIG. 1 at different stages of the assembly process.
Figure 3:
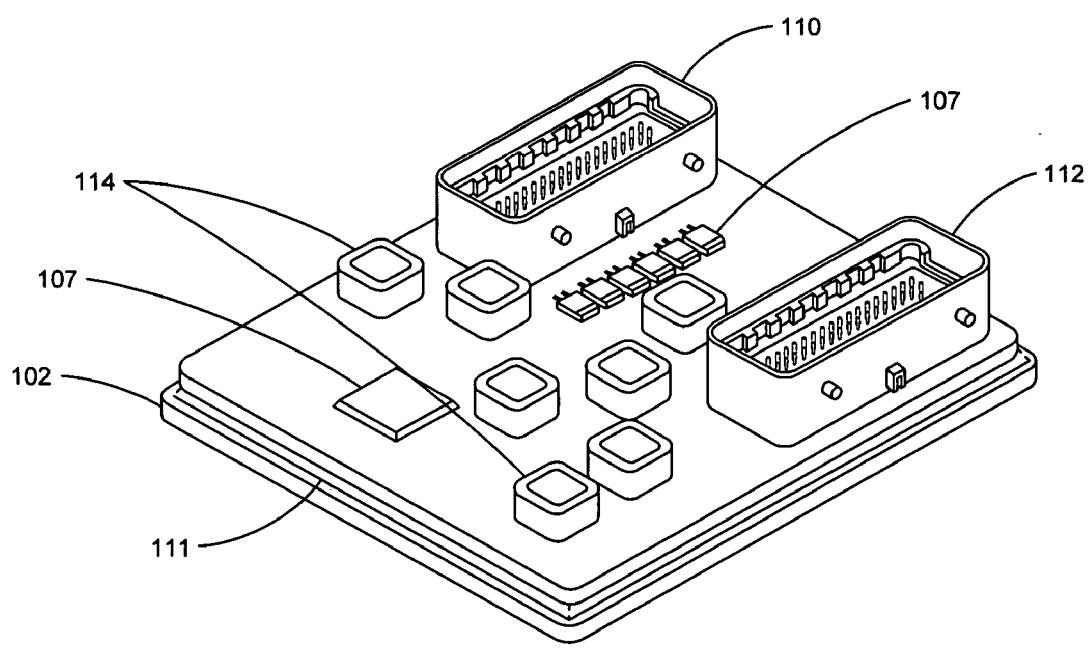

With reference to FIGS. 2 and 3, the overmolded electronic assembly 100 of FIG. 1 is depicted prior to placement of the heat sinks 114 on the flip-chips 106 and after placement of the heat sinks 114 on the flip-chips 106, respectively. With reference again to FIG. 1, the overmold material 120 is shown covering the component side of the substrate 104 and encompassing the heat sinks 114.

Accordingly, an overmolded electronic assembly has been described herein, which advantageously allows for the utilization of high thermally conductive heat sinks made of materials such as copper. The electronic assembly is not subject to typical mold clamp and overmold material induced stresses, which can cause the assembly to prematurely fail. An overmolded electronic assembly constructed as disclosed herein is particularly advantageous when utilized in the automotive environment, which increasingly requires assemblies to perform under environmental extremes.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. An overmolded electronic assembly, comprising:
   a substrate including a plurality of conductive traces formed on a first surface of the substrate;
   a plurality of surface mount technology (SMT) integrated circuit (IC) chips each including an active front side and a back side, wherein each of the IC chips is electrically coupled to one or more of the traces;
   a plurality of heat sinks each in thermal contact with the backside of a different one of the IC chips, wherein each of the heat sinks is independent of the other heat sinks;
   a backplate attached to a second surface of the substrate, wherein the second surface is opposite the first surface; and
   an overmold material covering the first surface of the substrate and maintaining the heat sinks in thermal contact with an associated one of the IC chips.

2. The assembly of claim 1, wherein the heat sinks are made of a metal.

3. The assembly of claim 2, wherein the metal is one of an aluminum and a copper.

4. The assembly of claim 1, wherein the second surface of the substrate is attached to the backplate with an adhesive.

5. The assembly of claim 4, wherein the adhesive is a pressure sensitive adhesive (PSA).

6. The assembly of claim 1, wherein the IC chips are flip-chips.

7. The assembly of claim 1, wherein the heat sinks are molded.

8. The assembly of claim 1, wherein the backplate is made of aluminum.

9. An overmolded electronic assembly, comprising:
   a substrate including a plurality of conductive traces formed on a first surface of the substrate;
   a plurality of surface mount technology (SMT) integrated circuit (IC) chips each including an active front side and a back side, wherein each of the IC chips is electrically coupled to one or more of the traces;
   a plurality of heat sinks each in thermal contact with the backside of a different one of the IC chips, wherein each of the heat sinks is independent of the other heat sinks;

a backplate attached to a second surface of the substrate, wherein the second surface is opposite the first surface; and an overmold material covering the first surface of the substrate and maintaining the heat sinks in thermal contact with an associated one of the IC chips.

10. The assembly of claim 1, wherein the heat sinks are made of a metal, and wherein the metal is one of an aluminum and a copper.

11. The assembly of claim 9, wherein the second surface of the substrate is attached to the backplate with an adhesive, and wherein the adhesive is a pressure sensitive adhesive (PSA).

12. The assembly of claim 9, wherein the IC chips are flip-chips.

13. The assembly of claim 9, wherein the heat sinks are molded.

14. The assembly of claim 9, wherein the backplate is made of aluminum.

15. An overmolded electronic assembly, comprising:
a substrate including a plurality of conductive traces formed on a first surface of the substrate;
a plurality of surface mount technology (SMT) integrated circuit (IC) chips each including an active front side and a back side, wherein each of the IC chips is electrically coupled to one or more of the traces;
a plurality of heat sinks each in thermal contact with the backside of a different one of the IC chips, wherein each of the heat sinks is independent of the other heat sinks;
a backplate attached to a second surface of the substrate, wherein the second surface is opposite the first surface; and
an overmold material covering the first surface of the substrate and maintaining the heat sinks in thermal contact with an associated one of the IC chips, wherein the heat sinks are made of a metal, and wherein the metal is one of an aluminum and a copper.

16. The assembly of claim 15, wherein the second surface of the substrate is attached to the backplate with an adhesive, and wherein the adhesive is a pressure sensitive adhesive (PSA).

17. The assembly of claim 15, wherein the IC chips are flip-chips.

18. The assembly of claim 15, wherein the heat sinks are molded.

19. The assembly of claim 15, wherein the backplate is made of aluminum.

* * * * *